(12) United States Patent
Zaki et al.

(10) Patent No.: US 10,168,373 B2
(45) Date of Patent: Jan. 1, 2019

(54) DIAGNOSTIC DEVICE FOR CHECKING A CONTROL SIGNAL LINE

(71) Applicant: AUDI AG, Ingolstadt (DE)

(72) Inventors: Sami Zaki, Regensburg (DE); Niklas Schalli, München (DE)

(73) Assignee: Audi AG, Ingolstadt (DE)

( * ) Notice: Subject to any disclaimer, the term of this patent is extended or adjusted under 35 U.S.C. 154(b) by 216 days.

(21) Appl. No.: 14/412,627

(22) PCT Filed: Jun. 21, 2013

(86) PCT No.: PCT/EP2013/001840
§ 371 (c)(1),
(2) Date: Jan. 2, 2015

(87) PCT Pub. No.: WO2014/005674
PCT Pub. Date: Jan. 9, 2014

(65) Prior Publication Data
US 2015/0160281 A1    Jun. 11, 2015

(30) Foreign Application Priority Data

Jul. 5, 2012    (DE) .................. 10 2012 013 405

(51) Int. Cl.
*G01R 31/02*    (2006.01)
*B60L 3/00*    (2006.01)
(Continued)

(52) U.S. Cl.
CPC .......... *G01R 31/021* (2013.01); *B60L 3/0023* (2013.01); *B60L 3/12* (2013.01);
(Continued)

(58) Field of Classification Search
CPC ....... G01R 31/02; G01R 31/00; G01R 31/025
See application file for complete search history.

(56) References Cited

U.S. PATENT DOCUMENTS 7,688,024 B2 *   3/2010   Kamaga ................ B60L 3/0069
                                                        180/65.21
8,551,636 B2    10/2013   Schalli
(Continued)

FOREIGN PATENT DOCUMENTS

CN    102130487 A    7/2011
CN    102159421 A    8/2011
(Continued)

OTHER PUBLICATIONS

Resistors in Parallel, http://www.electronics-tutorials.ws/resistor/res_4.html.*
(Continued)

*Primary Examiner* — Giovanni Astacio-Oquendo
*Assistant Examiner* — Alvaro Fortich
(74) *Attorney, Agent, or Firm* — Henry M. Feiereisen LLC

(57) ABSTRACT

A diagnostic device for checking a control signal wire between a controller of a motor vehicle and a charging port for a battery of the motor vehicle located on the motor vehicle side is disclosed, wherein on the charging port side, a first resistor is provided in the controller connecting the control signal wire to chassis ground, and a second resistor connected in parallel to the first resistor is provided. An evaluation device of the controller has a current source and/or a voltage source for supplying an electric current and/or a voltage independent of a charging process, and is configured to measure an electric current indicating a defect in the control signal wire, or a voltage indicating a defect in the control signal wire, utilizing the first and the second resistor.

10 Claims, 1 Drawing Sheet

(51) Int. Cl.
  *B60L 3/12*   (2006.01)
  *B60L 11/18*  (2006.01)
  *G01R 31/00*  (2006.01)
(52) U.S. Cl.
  CPC ....... *B60L 11/1816* (2013.01); *B60L 11/1838* (2013.01); *B60L 11/1848* (2013.01); *G01R 31/006* (2013.01); *G01R 31/026* (2013.01); *Y02T 10/7005* (2013.01); *Y02T 10/7072* (2013.01); *Y02T 90/121* (2013.01); *Y02T 90/128* (2013.01); *Y02T 90/14* (2013.01); *Y02T 90/163* (2013.01); *Y02T 90/169* (2013.01); *Y04S 30/14* (2013.01)

(56) References Cited

U.S. PATENT DOCUMENTS

| | | | | |
|---|---|---|---|---|
| 2002/0021111 A1* | 2/2002 | Ogino | | H02J 7/166 322/28 |
| 2004/0008096 A1* | 1/2004 | Liu | | H03H 11/48 333/214 |
| 2004/0189309 A1* | 9/2004 | Bertness | | G01R 31/3648 324/426 |
| 2006/0028179 A1* | 2/2006 | Yudahira | | G01R 19/16542 320/133 |
| 2008/0231286 A1* | 9/2008 | Tsunekazu | | G01R 31/024 324/509 |
| 2009/0039703 A1* | 2/2009 | Soma | | B60K 6/28 307/10.1 |
| 2009/0102433 A1 | 4/2009 | Kamaga | | |
| 2009/0184700 A1* | 7/2009 | Kanayama | | H02M 3/158 323/282 |
| 2009/0212627 A1* | 8/2009 | Sakata | | H02H 9/001 307/10.7 |
| 2010/0006360 A1* | 1/2010 | Kishimoto | | B60K 6/34 180/65.285 |
| 2010/0007306 A1* | 1/2010 | Fukui | | B60K 6/445 320/107 |
| 2010/0141483 A1* | 6/2010 | Thacher | | G01S 13/825 340/989 |
| 2010/0207635 A1* | 8/2010 | Plagens | | B60L 3/0023 324/509 |
| 2011/0000726 A1* | 1/2011 | Tanaka | | B60K 6/48 180/65.265 |
| 2011/0057658 A1 | 3/2011 | Yugou et al. | | |
| 2012/0025769 A1* | 2/2012 | Kikuchi | | B60L 3/0046 320/118 |
| 2012/0098488 A1* | 4/2012 | Ichikawa | | B60L 11/1816 320/109 |
| 2012/0098490 A1* | 4/2012 | Masuda | | B60L 3/0069 320/109 |
| 2012/0119702 A1* | 5/2012 | Gaul | | B60L 3/0069 320/109 |
| 2012/0139489 A1* | 6/2012 | Gaul | | B60L 11/1816 320/109 |
| 2012/0212235 A1* | 8/2012 | Hein | | B60L 11/1816 324/503 |
| 2012/0249069 A1* | 10/2012 | Ohtomo | | B60L 1/08 320/109 |
| 2013/0031398 A1* | 1/2013 | Srivastava | | H02H 9/046 713/340 |
| 2013/0162261 A1* | 6/2013 | Szoke | | G01R 31/025 324/503 |
| 2013/0193932 A1 | 8/2013 | Schalli | | |
| 2013/0234672 A1* | 9/2013 | Kubota | | H02J 7/0016 320/134 |
| 2013/0311118 A1* | 11/2013 | Sejima | | G01R 31/362 702/63 |

FOREIGN PATENT DOCUMENTS

| | | |
|---|---|---|
| DE | 4109586 A1 | 9/1992 |
| DE | 199 48 968 A1 | 4/2001 |
| DE | 10 2004 041 008 A1 | 8/2005 |
| DE | 10 2009 025 302 A1 | 12/2010 |
| DE | 10 2010 011 162 A1 | 2/2011 |
| DE | 10 2010 030 826 A1 | 1/2012 |
| EP | 2 447 106 A1 | 5/2012 |
| JP | H 0396873 A | 4/1991 |
| JP | 2011-35985 A | 2/2011 |

OTHER PUBLICATIONS

Charles K. Alexander and Matthew Sadiku, Fundamentals of Electric Circuits, Third Edition, p. 34.*
Merriam-Webster Dictionary "Parallel".*
Merriam-Webster Dictionary "Comprise".*
DC Circuits.*
Resistors in Parallel.*
International Search Report issued by the European Patent Office in International Application PCT/EP2013/001840.
Chinese Search Report issued by the Chinese Patent Office in Chinese Patent Application No. 201380035261.0 dated May 16, 2016.
English translation of Chinese Search Report issued by the Chinese Patent Office in Chinese Patent Application No. 201380035261.0 dated May 16, 2016.

* cited by examiner

DIAGNOSTIC DEVICE FOR CHECKING A CONTROL SIGNAL LINE

CROSS-REFERENCES TO RELATED APPLICATIONS

This application is the U.S. National Stage of International Application No. PCT/EP2013/001840, filed Jun. 21, 2013, which designated the United States and has been published as International Publication No. WO 2014/005674 A1 and which claims the priority of German Patent Application, Serial No. 10 2012 013 405.3, filed Jul. 5, 2012, pursuant to 35 U.S.C. 119(a)-(d).

BACKGROUND OF THE INVENTION

The invention relates to a diagnostic device for checking a control signal wire between a controller of a motor vehicle and a motor vehicle-side charging terminal for a battery of the motor vehicle. In addition, the invention relates to a motor vehicle and a method for detecting a defect of a control signal wire.

Motor vehicles with an electric motor are already widely known in the art, in particular in form of electric motor vehicles or, if they additionally include an internal combustion engine, in form of hybrid vehicles. A battery, usually a high-voltage battery, is provided in the vehicle for operating the electric motor of the motor vehicle. The battery can be charged by suitable charging devices (charging stations) located outside the motor vehicle.

Motor vehicles therefore usually have as part of the charging infrastructure a vehicle side charging port (charging socket), into which a plug of the charger can be plugged. The charging port is connected or can be connected to the battery via a single wire or a three-phase wire to allow charging of the battery; in addition, however, a control signal wire ("control pilot", abbreviated as CP) is usually present to enable the exchange of control signals. On the one hand, a charge-ready state of the motor vehicle can be communicated to the charging device via the control signal wire; however, additionally or alternatively, it is also possible to communicate over the control signal wire that the charging device is ready to supply power to the motor vehicle. For example, pulse-width-modulated control signal can be used to exchange information.

On the motor vehicle side, the control signal is evaluated and/or generated in a controller, for example a charging controller and/or battery controller, which includes a corresponding logic device.

If the control signal is not present, for example due to a defect in the control signal wire between the controller and the charging port and/or due to a defect in the charging cable or on the side of the charging device, charging is usually not possible. In particular, however, it is presently not possible to determine whether a fault has occurred in the vehicle itself or in the charging infrastructure, specifically, for example, in the charging cable and/or in the charging device.

SUMMARY OF THE INVENTION

It is therefore an object of the invention to enable checking of a vehicle-side control signal wire disposed between a controller of the motor vehicle and a vehicle-side charging port, which can be easily implemented commensurate with existing standards.

To solve this problem, a diagnostic device of the aforementioned type is provided, which is characterized in that a first resistor which connects the control signal wire to ground is provided in the controller, and a second resistor connected in parallel with the first resistor is provided on the side of the charging port, wherein an evaluation device of the controller has a current source and/or a voltage source for supplying a current and/or a voltage outside a charging process and is configured to measure a current indicating a control signal wire defect or a voltage indicating a control signal wire defect by using the first and the second resistor.

Thus, with the present invention, a diagnostic device is proposed for the first time which is capable of testing the control signal wire from the controller all the way to the charging port (charging socket), thereby enhancing the diagnostic capabilities in the controller. It is particularly advantageous that this diagnosis can be performed outside the charging process, in particular during the operation of the motor vehicle, and more particular on a regular basis (so-called "open load" diagnostic). It can thus be determined at any time, whether a defect has occurred in the control signal wire in the motor vehicle itself.

It is presently already customary, in particular as part of various standards, to provide on the vehicle side in the controller a specific resistor with a certain value disposed between the control signal wire and the ground wire. This is particularly true when a charge-ready state should be communicated to the battery by connecting a charge-ready resistor in the controller in parallel with the resistor via a charge-ready switch. Also, the charge-ready resistor may have a standardized value. According to the standard IEC 61851 at the time the present invention was filed, for example, a resistor in a motor vehicle according to the prior art may have value of 2.74 Ω, while a charge-ready resistor may have value of 1.3 kΩ or 270 Ω. Starting from the prior art, according to the underlying concept of the present invention, the previously single resistor used in the controller is divided into two resistors, namely the currently used conventional first resistor on the controller side and the second resistor connected in parallel with the first resistor on the side of the charging port. The resistance values of the first and the second resistor can then be selected so that standards are satisfied, for example by using for the first and second resistor a resistance value that is twice as high.

In general, the present invention therefore proposes to use a combination of resistors connected in parallel on both sides of the control signal wire within the motor vehicle, namely the first resistor disposed in the controller and the second resistor disposed in the charging port. When an evaluation device now uses an evaluation circuit that provides different measurement values, depending on whether the second resistor is available, a fault in the control signal wire can be readily detected even in the absence of a charging process, which can be accomplished according to the invention by measuring either a current flow or a voltage flow. For this reason, the controller includes a current source or a voltage source, which can be activated outside a charging operation for diagnostic purposes and which generates a measured voltage or a corresponding measured current that depends on the "visibility" of the second resistance. This voltage or current can be readily evaluated, for example by a logic circuit already existing in a controller. For example, a bit indicating an error may be set in the control signal wire; alternatively or in addition, an entry may be stored in a fault memory and/or a corresponding warning light for the driver may be activated.

Especially with regard to compliance with standards, the first and the second resistors may advantageously have the same value. Because the first and the second resistor are connected in a parallel circuit, when a certain resistance value is required by a standard, each of the first resistor and the second resistor may, for example, have twice the resistance value of the standard value, so that the standard value "appears" again on the outside due to the parallel connection.

As already described, the charging port may be designed as a charging socket, with the second resistor being arranged in the charging socket and likewise connecting the control signal wire to ground.

Both resistors may be connected to a combined, common ground wire. Frequently, a ground wire is also run from the charging port to the controller (and also to the battery), so that this already existing ground wire can be used to connect the control signal wire to ground via the resistors both on the charging port side and on the controller side. Any other way to make a connection to ground can also be used, for example a connection to the body of the motor vehicle or the like.

In a first particularly preferred embodiment of the present invention, the evaluation device may have a measuring resistor connected downstream of the voltage source so as to form in conjunction with the first and the second resistor a voltage divider. In other words, a series circuit is formed of the measuring resistor and the parallel circuit of the first and of the second resistor, via which the voltage source is connected to ground. This represents a classic voltage divider. When the measured voltage is tapped between the measuring resistor and the parallel circuit, the measured voltage, as is generally known, depends on the value of the effective resistance of the parallel circuit, i.e. whether the control signal wire is sufficiently intact so that the second resistor also contributes to the total resistance of the parallel circuit. If the control signal wire is defective, then the second resistor is ultimately replaced by an infinitely large resistance, so that only the first resistor is actually seen in the parallel circuit, which causes a change in the measured voltage.

Consequently, the evaluation device may be designed to detect a control signal wire defect when measuring on the parallel circuit formed of the first and the second resistor a voltage that corresponds only to the first resistor. In this case, the already existing logic circuit of the controller, which is able to detect different voltages applied to the parallel circuit, can be used or extended accordingly. For example, it is conceivable to tap the measured voltage, i.e. the voltage indicating a control signal wire defect, at the input of an analog-to-digital converter; however, other types of measuring devices and measuring circuits known a person of skill in the art may be used.

In summary, in this first embodiment, the concept of a voltage divider is used to generate with the voltage source different measured voltages applied to the parallel circuit, depending on whether the control signal wire is intact or not.

In a second, less preferred embodiment, it is also conceivable to create an evaluation circuit by using the first and the second resistor in which a current is fed by a current source, which produces different values of the measured current, depending on whether the second resistor is accessible. For example, the current source may be designed to apply a predetermined current by connecting the first and the second resistor in parallel, wherein the evaluation device includes a current measuring device for measuring the current flowing through the first resistor. In this embodiment, the parallel circuit is thus used as a current divider. If both resistance values are identical, half the current flows through each of the resistors. If the control signal wire is defect, current cannot flow through the second resistor and the total current flows through the first resistor. The current flowing through the first resistor can therefore be measured as a measuring current, indicating when a control signal wire is defect. For this embodiment, however, a current measuring device is required, so that already existing components of the logic circuit cannot be used.

In another embodiment of the present invention, the evaluation device may further include switching means for selectively connecting the voltage source and/or the current source for carrying out a diagnostic process outside a charging process. In this way, diagnostic process may be initiated outside of charging processes by closing the switching means wherein the measured voltage and the measured current is then recorded. Such diagnostic processes may be initiated, especially cyclically, by the controller itself or by other controllers, for example as part of a more extensive diagnostic process of the motor vehicle, which may also be performed cyclically.

In addition to the diagnostic device, the present invention also relates to a motor vehicle with a diagnostic device according to the invention. With the diagnostic device according to the invention, such a motor vehicle is therefore able to detect automatically a defect in a control signal wire between a charging port and a controller. All statements regarding the diagnostic device of the present invention can analogously be applied to the motor vehicle according to the invention, so that the aforementioned advantages can also be achieved with the motor vehicle.

Lastly, the present invention also relates to a method for detecting a defect of a control signal wire between a controller of a motor vehicle and a motor vehicle-side charging port for a battery of the motor vehicle, which method is characterized in that a first resistor is used in the controller to connect the control signal wire to ground and a second resistor, connected in parallel with the first resistor, is used on the side of the charging port, wherein outside a charging process a voltage and/or a current is fed into the circuit that includes the first and the second resistor and wherein at another location of the circuit, a current that depends on the availability of the second resistor is measured or a voltage that depends on the availability of the second resistor is measured and evaluated with respect to the control signal wire defect. All statements concerning the diagnostic device according to the invention can also be applied to the method according to the invention, which can advantageously be carried out using a diagnostic device according to the invention. It is therefore also checked with the method according to the invention whether the second resistance is accessible and whether therefore the control signal wire is defective.

BRIEF DESCRIPTION OF THE DRAWING

Further advantages and details of the present invention will become apparent from the examples and embodiments described below with reference to the drawings. The drawings show in.

DETAILED DESCRIPTION OF PREFERRED EMBODIMENTS

Figure 1:
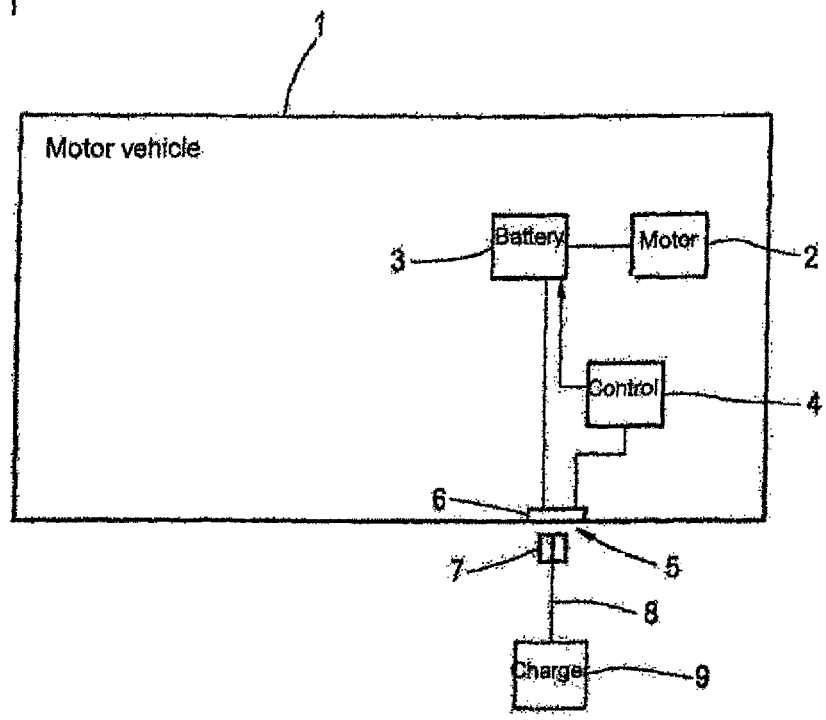
FIG. 1 a schematic diagram of a motor vehicle according to the invention.

FIG. 1 shows a schematic diagram of a motor vehicle 1 according to the invention. Since the motor vehicle 1 is an electric vehicle, it includes an electric motor 2 powered by a battery 3 (high voltage battery). The operation of the battery 3, and in particular also its charging operation, is controlled by the battery controller 4. For charging the battery 3, the motor vehicle 1 includes a charging port 5 in the form of a charging socket 6, wherein control signals are transmitted to the controller 4, while energy is being transferred to the battery 3.

The motor vehicle 1 can be connected to a charging device 9 (charger) by way of a plug 7 of an only schematically indicated charging cable 8, thereby enabling a charging process.

The charging process is determined in part by control signals, which can be exchanged between the controller 4 and the charging device 9. A special control signal connection (control pilot) is provided for this purpose.

Figure 2:
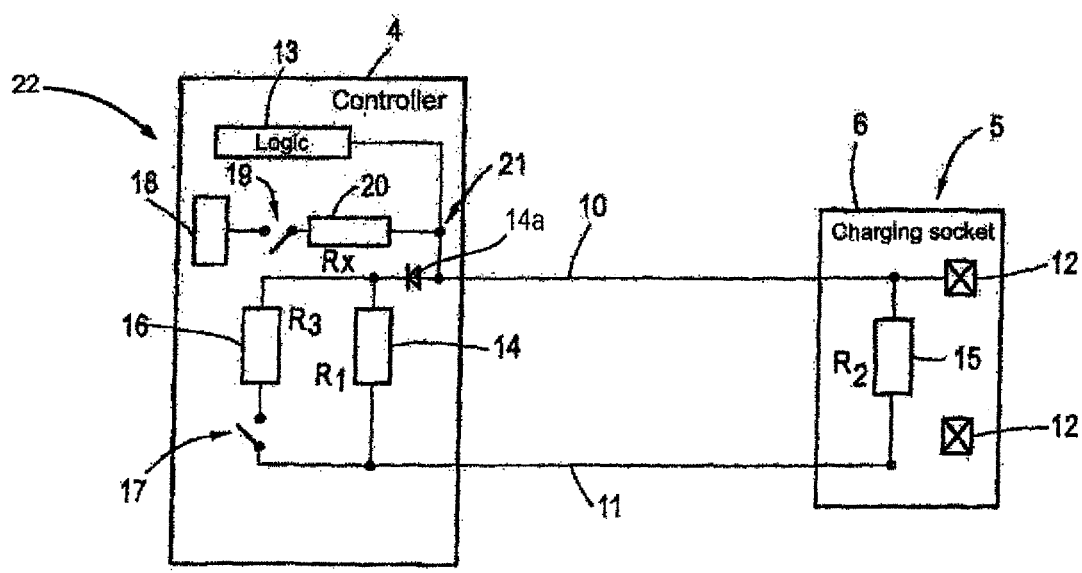
FIG. 2 a diagram illustrating the operation of the diagnostic device according to the invention.

FIG. 2 shows in more detail the implementation of the connection between the controller 4 and the charging port 5 inside the motor vehicle 1. For sake of clarity, power supply lines and the like are not shown. A control signal wire 10 and a ground wire 11 connected to corresponding pins 12 are provided between the charging socket 6 and the controller 4. As indicated, the signal of the control signal wire 10 is forwarded to a logic circuit 13 of the controller 4, where it can be evaluated in a conventional manner.

As will now be illustrated in more detail below, the controller 4 is configured to perform the method according to the invention; for this purpose, components of a diagnostic device according to the invention are realized in the charging port 5 as well as in the controller 4.

The control signal wire 10 is connected in the controller 4 to the ground wire 11 by way of a first resistor 14 connected to a diode 14a. A second resistor 15 inside the charging socket 6 is electrically, connected in parallel with a group consisting of the diode 14a and the first resistor 14, and also connects the control signal wire 10 to the ground wire 11. The value $R_1$ of the first resistor 14 is in this example identical to the value $R_2$ of the second resistor 15 so that the parallel circuit formed of the second resistor 15 and the group consisting of the first resistor 14 and the diode 14a acts as a single resistor having half the resistance value of $R_1$ and/or $R_2$. In the present example, $R_1=R_2=5.48$ k$\Omega$, so that the effective resistance of the parallel circuit is 2.74 k$\Omega$, thus satisfying a standard based on a charge-ready state resistor 16 having the value $R_3=1.3$ k$\Omega$. A charge-ready state switch 17 is associated with the charge-ready state resistor 16, wherein the charge-ready state switch 17 is closed when a charge-ready state of the battery 3 is indicated, which enables detection of a change in resistance by a charging device.

However, because the diagnostic process according to the invention takes place outside the charging process, the charge-ready state switch 17 is open anyway, so that only the parallel-connected resistors 14 and 15 are relevant. By arranging the second resistor 15 on the side of the charging port, a diagnosis of the control signal wire 10 is made possible by using an evaluation device 22, as explained in more detail below.

As part of the evaluation device 22, a voltage source 18 is provided inside the controller 4. When a switching means 19 is closed for initiating the diagnostic operation, the voltage source 18 is coupled to the parallel circuit composed of the resistors 14 and 15 via a measuring resistor 20 having the resistance value $R_x$; in other words, the measuring resistor 20 and the parallel circuit formed of the resistors 14 and 15 are connected in series with respect to the voltage source, thus resulting in a voltage divider, meaning that the measured voltage tapped at the point 21 depends on the resistance value of the parallel circuit formed of the resistors 14 and 15.

The value of the measured voltage 21 can be measured via the logic circuit 13, optionally suitably expanded, during the diagnostic process, which takes place outside the charging process, wherein the measured voltage value depends on whether the second resistor 15 is accessible, i.e. on whether the control signal wire 10 is intact.

If the control signal wire 10 is intact, then the parallel circuit has the effective resistance of the two parallel-connected resistors 14 and 15, and consequently $$R_p = \frac{R_1 * R_2}{R_1 + R_2} = \frac{R_1}{R_2},$$

as already explained above. However, if the control signal wire 10 is defective, an infinitely large resistance is assumed instead of the second resistor 15, so that effectively only the first resistor $R_1$ can be detected in the parallel circuit 14. Accordingly, different voltages are produced that can be associated with a defect in the control signal wire 10.

As already stated, the measurement voltage can be readily detected and measured by way of the logic circuit 13, which already evaluates the transmitted, in particular pulse-width-modulated, control signals, for example at the input of an analog-to-digital converter or of another voltage measuring device. An error bit can be set depending on the value of the measured voltage, i.e. the information whether a control signal wire defect is present or not, an entry can stored in a fault memory and/or a warning light for the driver can be controlled. However, other measures are also conceivable. The diagnostic process described herein, can for example be performed cyclically for the duration when the switching means 19 is closed. The switching means 19 is then opened again following completion of the measurement. A diagnostic process does not take place while a charging process is taking place. The switching means 19 is then generally open.

In the exemplary embodiment of the present invention illustrated in FIG. 2, a voltage divider is formed as an evaluation circuit, which is fed from the voltage source 18. In alternative exemplary embodiments, however, it is also conceivable to use a current source which generates a corresponding variable output current at a different location of the modified evaluation circuit, for example similar to a current divider.

What is claimed is:

1. A diagnostic device for checking a control signal wire disposed between a controller of a motor vehicle and a vehicle-side charging port for a battery of the motor vehicle, the diagnostic device comprising:
   a first resistor and a diode arranged in the controller, said first resistor connecting the control signal wire to ground,
   a second resistor connected electrically in parallel with a group consisting of the diode and the first resistor on the vehicle-side charging port,
   an evaluation device of the controller comprising at least one of a current source and a voltage source arranged in the controller for supplying a current or a voltage when the battery is not being charged, said evaluation device configured to measure a current or a voltage indicating a control signal wire defect by using the parallel connection of the first and the second resistor.

2. The diagnostic device of claim 1, wherein the first and the second resistor have identical resistance values.

3. The diagnostic device of claim 1, wherein the second resistor is arranged in a charging socket of the charging port.

4. The diagnostic device of claim 1, wherein the first and the second resistor are connected to a common ground wire.

5. The diagnostic device of claim 1, wherein the evaluation device comprises a measuring resistor connected downstream of the voltage source so as to form a voltage divider in conjunction with the first and the second resistor.

6. The diagnostic device of claim 5, wherein the evaluation device is configured to detect the control signal wire defect when measuring across the parallel connection of the first and the second resistor a voltage that corresponds only to the voltage of the first resistor.

7. The diagnostic device of claim 1, wherein the current source is configured to apply a predetermined current through the parallel circuit formed of the first and the second resistor, wherein the evaluation device comprises a current measuring device for measuring the current flowing through the first resistor.

8. The diagnostic device of claim 1, wherein the evaluation device further comprises a switching device for selectively connecting the voltage source or the current source for carrying out a diagnostic operation outside a charging process of the battery.

9. A motor vehicle comprising a diagnostic device for checking a control signal wire disposed between a controller of a motor vehicle and a vehicle-side charging port for a battery of the motor vehicle, the diagnostic device comprising:
a first resistor and a diode arranged in the controller, said first resistor connecting the control signal wire to ground,
a second resistor connected electrically in parallel with a group consisting of the diode and the first resistor on the vehicle-side charging port,
an evaluation device of the controller comprising at least one of a current source and a voltage source arranged in the controller for supplying a current or a voltage when the battery is not being charged, said evaluation device configured to measure a current or a voltage indicating a control signal wire defect by using the parallel connection of the first and the second resistor.

10. A method for detecting a control signal wire defect of a control signal wire disposed between a controller of a motor vehicle and a charging port for a battery of the motor vehicle, the method comprising:
connecting the control signal wire to ground by way of a first resistor and a diode arranged in the controller,
electrically connecting a second resistor arranged on a vehicle-side charging port in parallel with a group consisting of the diode and the first resistor,
feeding a voltage or a current to a circuit comprising the first and the second resistor when the battery is not being charged,
measuring at another location of the circuit a current or a voltage that depends on whether the second resistor is available in the circuit, by utilizing the parallel connection of the group consisting of the diode and the first resistor and the second resistor, and
evaluating with an evaluation device the measured current or voltage with respect to the control signal wire defect, said evaluation device comprising at least one of a current source and a voltage source arranged in the controller.

* * * * *